US006476316B1

(12) United States Patent
Elco

(10) Patent No.: US 6,476,316 B1
(45) Date of Patent: *Nov. 5, 2002

(54) LOW CROSS TALK AND IMPEDANCE CONTROLLED ELECTRICAL CABLE ASSEMBLY

(75) Inventor: Richard A. Elco, Mechanicsburg, PA (US)

(73) Assignee: FCI Americas Technology, Inc., Reno, NV (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/148,279

(22) Filed: Sep. 4, 1998

Related U.S. Application Data

(63) Continuation of application No. 08/452,021, filed on Jun. 12, 1995, now Pat. No. 5,817,973.

(51) Int. Cl.[7] .................................................. H05K 9/00
(52) U.S. Cl. ................ 174/32; 174/117 F; 174/117 AS
(58) Field of Search ............................. 174/32, 36, 27, 174/28, 117 F, 117 AS, 100, 114 R, 252

(56) References Cited

U.S. PATENT DOCUMENTS 2,740,095 A * 3/1956 Somes ......................... 333/96
3,417,190 A 12/1968 Body et al.
3,571,488 A 3/1971 Douglass
3,708,606 A 1/1973 Shattes et al.
4,403,103 A 9/1983 Cookson
4,605,915 A 8/1986 Marshall et al.
RE32,691 E 6/1988 Dola et al.
4,785,135 A 11/1988 Ecker et al.
4,798,918 A 1/1989 Kabadi et al.
4,932,888 A 6/1990 Senor
4,980,223 A * 12/1990 Nakano et al. ........... 174/36 X
5,012,047 A 4/1991 Dohya
5,036,160 A 7/1991 Jackson
5,046,960 A 9/1991 Fedder
5,094,623 A 3/1992 Scharf et al.
5,169,324 A 12/1992 Lemke et al.
5,174,770 A 12/1992 Sasaki et al.
5,195,899 A 3/1993 Yatsu et al.
5,215,473 A 6/1993 Brunker et al.
5,217,392 A * 6/1993 Hosler, Sr. .................. 439/585
5,286,212 A 2/1994 Broeksteeg
5,294,755 A * 3/1994 Kawakami et al. ....... 174/36 X
5,357,050 A 10/1994 Baran et al.
5,426,399 A 6/1995 Matsubayashi et al.
5,561,271 A * 10/1996 Bruck et al. ......... 174/117 F X
5,817,973 A * 10/1998 Elco ............................ 174/32

FOREIGN PATENT DOCUMENTS

EP 0366046 5/1990
JP 10246713 10/1989

OTHER PUBLICATIONS

1993 Berg electronics Product Catalog pp. 3–4 Micropax™ High–Density Board–to–Board System.

* cited by examiner

*Primary Examiner*—Chau N. Nguyen
(74) *Attorney, Agent, or Firm*—Steven M. Reiss; M. Richard Page

(57) ABSTRACT

An electrical cable assembly in which the conductive and dielectric elements are arranged in a composite with a conductive I-beam shaped geometry in which the conductive element is perpendicularly interposed between two parallel dielectric and ground plane elements. Low cross talk and controlled impedance are found to result from the use of this geometry.

29 Claims, 18 Drawing Sheets

MEASURED CROSSTALK
AT 35 PSEC.

LOW CROSS TALK AND IMPEDANCE CONTROLLED ELECTRICAL CABLE ASSEMBLY

CROSS REFERENCE TO RELATED APPLICATION

This application is a continuation of U.S. patent application Ser. No. 08/452,021, filed on Jun. 12, 1995, now U.S. Pat. No. 5,817,973 and is related to U.S. patent application Ser. No. 08/452,020 filed on Jun. 12, 1995, now abandoned, both of which are herein incorporated by reference.

BACKGROUND OF THE INVENTION

1. Field of the Invention

The present invention relates to electrical connectors and more particularly to electrical connectors including means for controlling electrical cross talk and impedance.

2. Brief Description of Prior Developments

As the density of interconnects increases and the pitch between contacts approaches 0.025 inches or 0.5 mm, the close proximity of the contacts increases the likelihood of strong electrical cross talk coupling between the contacts. In addition, maintaining design control over the electrical characteristic impedance of the contacts becomes increasingly difficult. In most interconnects, the mated plug/receptacle contact is surrounded by structural plastic with air spaces to provide mechanical clearances for the contact beam. As is disclosed in U.S. Pat. No. 5,046,960 to Fedder, these air spaces can be used to provide some control over the characteristic impedance of the mated contact. Heretofore, however, these air spaces have not been used, in conjunction with the plastic geometry, to control both impedance and, more importantly, cross talk.

SUMMARY OF THE INVENTION

In the connector of the present invention there is a first member and a second member each of which comprises a metallic contact means and a dielectric base means. On each member the metallic contact means extends perpendicularly from the dielectric base means. The two metallic contact means connect to form what is referred to herein as a generally "I-beam" shaped geometry. The concept behind the I-beam geometry is the use of strong dielectric loading through the structural dielectric to ground on the top and bottom of the mated contact edges and a relatively light loading through air on the mated contact sides. These different dielectric loadings are balanced in such a way as to maintain a controlled impedance and yet minimize coupling (and cross talk) between adjacent contacts. In this way, all lines of the interconnect can be dedicated to signals while maintaining a controlled impedance and a relatively low rise time-cross talk product of less than 1 nano-second percent. Typical rise time-cross talk values for existing 0.05 to 0.025 inch pitch controlled impedance interconnects range from 2.5 to 4 nano-second percent.

The I-beam geometry of this invention may also be advantageously used in an electrical cable assembly. In such an assembly a control support dielectrical web element is perpendicularly interposed between opposed flange elements. Each of the flange elements extend perpendicularly away from the terminal ends of the web element. On both of the opposed sides of the web there is a metalized signal line. The opposed end surfaces of the flanges are metalized to form a ground plane. Two or more such cable assemblies may be used together such that the flanges are in end to end abutting relation and the longitudinal axes of the conductive elements are parallel. An insulative jacket may also be positioned around the entire assembly.

BRIEF DESCRIPTION OF THE DRAWINGS

The invention is further described with reference to the accompanying drawings in which.

DETAILED DESCRIPTION OF THE PREFERRED EMBODIMENTS

THEORETICAL MODEL

Figure 1:
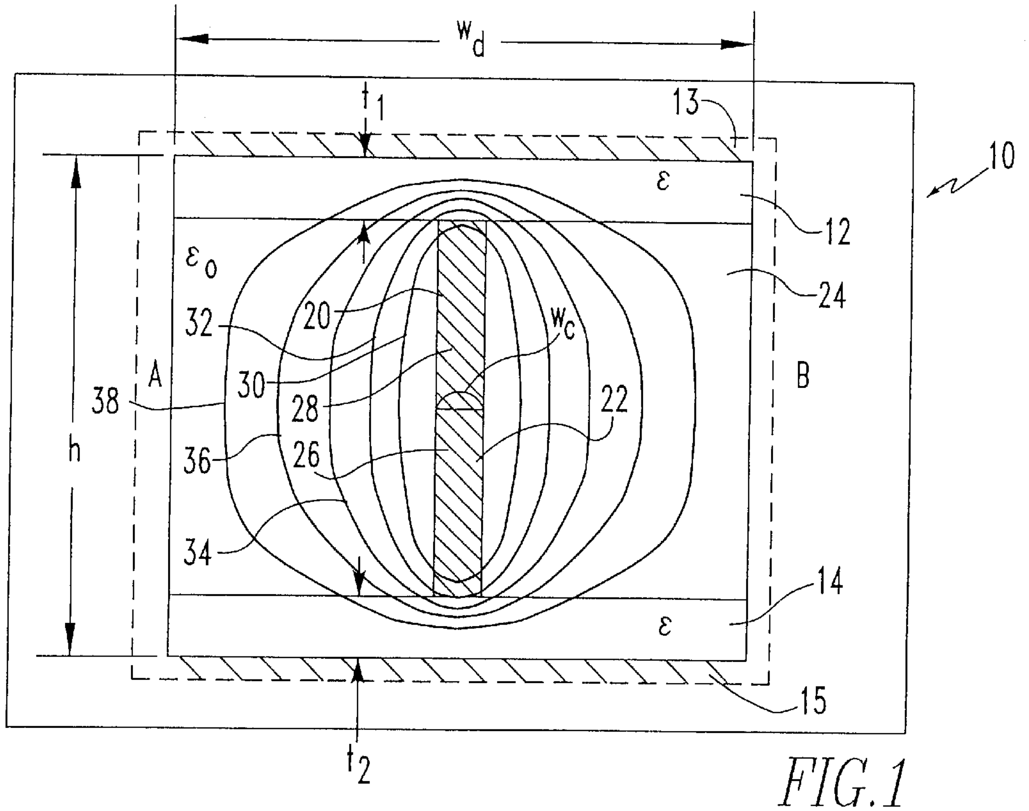
FIG. 1 is a schematic illustration of one preferred embodiment of the connector of the present invention.
Figure 1A:
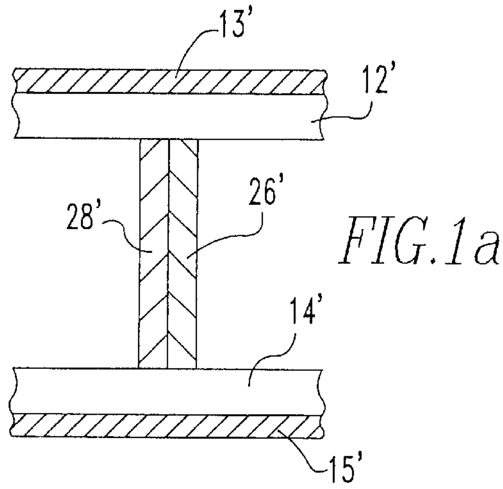
FIG. 1*a* is a schematic illustration of another preferred embodiment of the connector of the present invention.
Figure 2:
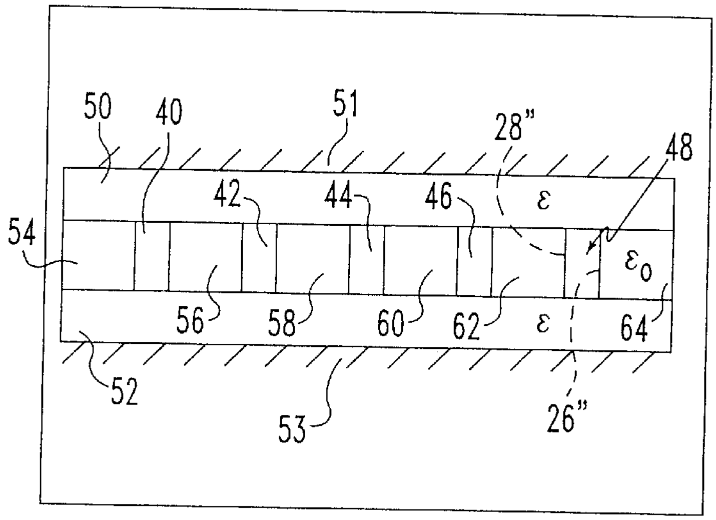
FIG. 2 is a schematic illustration of another preferred embodiment of the connector of the present invention.

The basic I-beam transmission line geometry is shown in FIG. 1. The description of this transmission line geometry as an I-beam comes from the vertical arrangement of the signal conductor shown generally at numeral 10 between the two horizontal dielectric 12 and 14 having a dielectric constant E and ground planes 13 and 15 symmetrically placed at the top and bottom edges of the conductor. The sides 20 and 22 of the conductor are open to the air 24 having an air dielectric constant $E_o$. In a connector application the conductor would be comprised of two sections 26 and 28 which abut end to end or face to face. The thickness, $t_1$ and $t_2$ of the dielectric layers 12 and 14, to first order, controls the characteristic impedance of the transmission line and the aspect ratio of the overall height h to dielectric width wd controls the electric and magnetic field penetration to an adjacent contact. The aspect ratio to minimize coupling beyond A and B is approximately unity as illustrated in FIG. 1. The lines 30, 32, 34, 36 and 38 in FIG. 1 are equipotentials of voltage in the air-dielectric space. Taking an equipotential line close to one of the ground planes and following it out towards the boundaries A and B, it will be seen that both boundary A or boundary B are very close to the ground potential. This means that at both boundary A and boundary B we have virtual ground surfaces and if two or more I-beam modules are placed side by side, a virtual ground surface exists between the modules and there will be no coupling between the modules. In general, the conductor width and dielectric thickness should be small compared to the dielectric width or module pitch. Given the mechanical constraints on a practical connector design, the proportioning of the signal conductor (blade/beam contact) width and dielectric thicknesses will, of necessity, deviate somewhat from the preferred ratios and some minimal coupling will exist between adjacent signal conductors. However, designs using the basic I-beam guidelines will have lower cross talk than more conventional approaches. Referring to FIG. 1*a*, an alternate embodiment is shown in which the dielectric is shown at 12' and 14' with their respective ground planes at 13' and 15'. In this embodiment the conductor 26' and 28' extend respectively from dielectric layers 12' and 14', but the conductors 26' and 28' abut side to side rather than end to end. An example of a practical electrical and mechanical I-beam design for a 0.025 inch pitch connector uses 8×8 mil beams 26" and 8×8 mil blades 28", which when mated, form an 8×16 mil signal contact and the contact cross-section is shown in FIG. 2. The dielectric thickness, t, is 12 mils. The voltage equipotentials for this geometry are shown in FIG. 3 where virtual grounds are at the adjacent contact locations and some coupling will now exist between adjacent contacts.

Referring to FIG. 2, the I-beam transmission geometry is shown as being adapted to a less than ideally proportioned multi-conductor system. Signal conductors 40, 42, 44, 46 and 48 extend perpendicularly between two dielectric and horizontal ground plane 50 mounted on base 51 and horizontal ground plane 52 mounted on base 53 which have a dielectric contstants ∈. To the sides of the conductors are air spaces 54, 56, 58, 60, 62 and 64.

Figure 3:
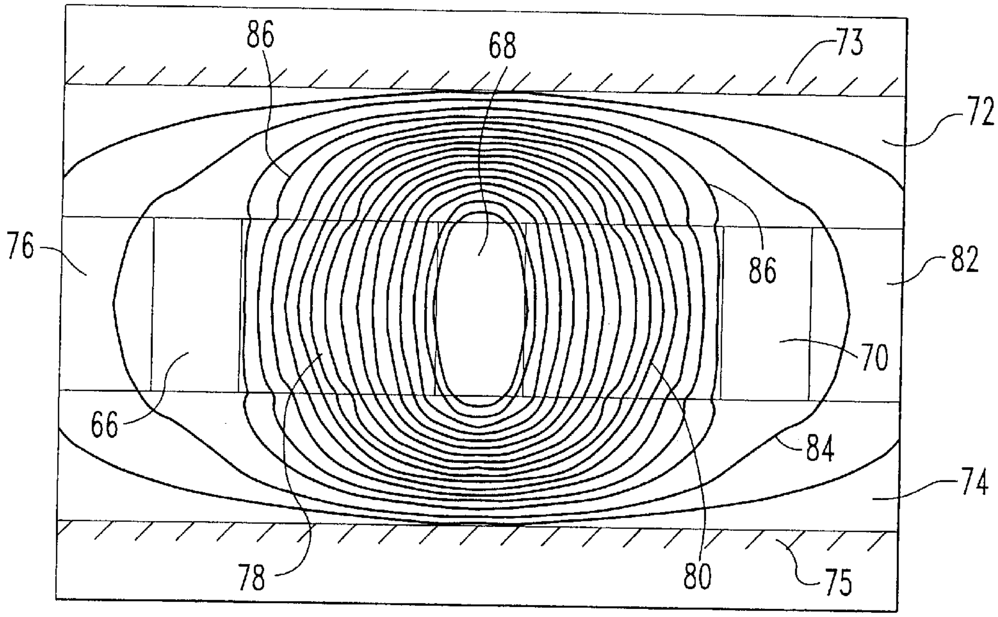
FIG. 3 is another schematic illustration of the connector illustrated in FIG. 2.
Figure 4:
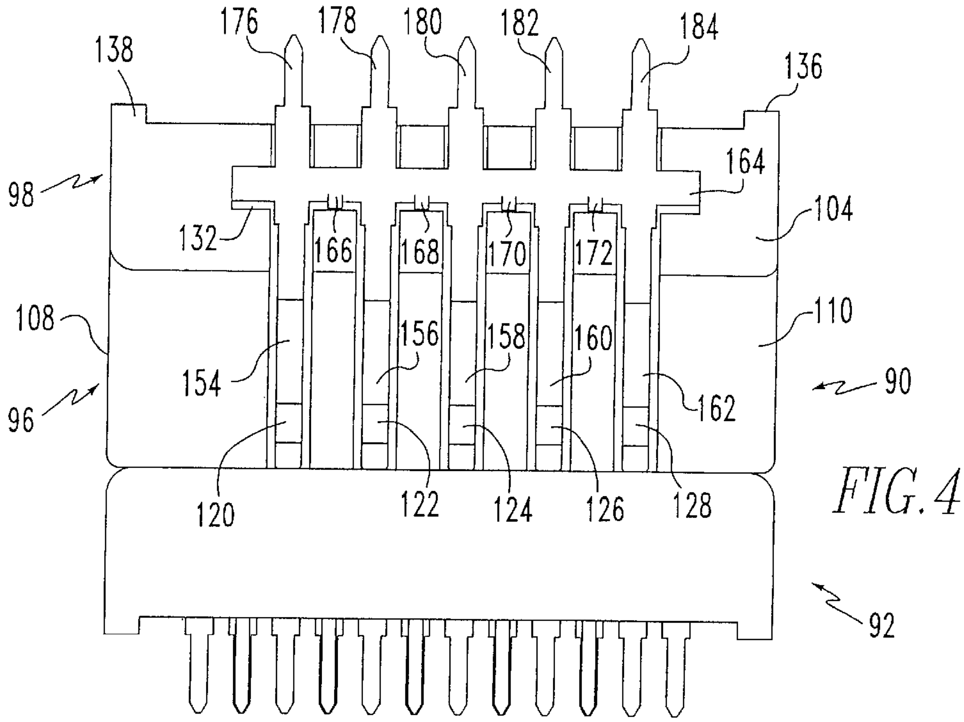
FIG. 4 is a side elevational view of another preferred embodiment of the connector of the present invention.
Figure 5:
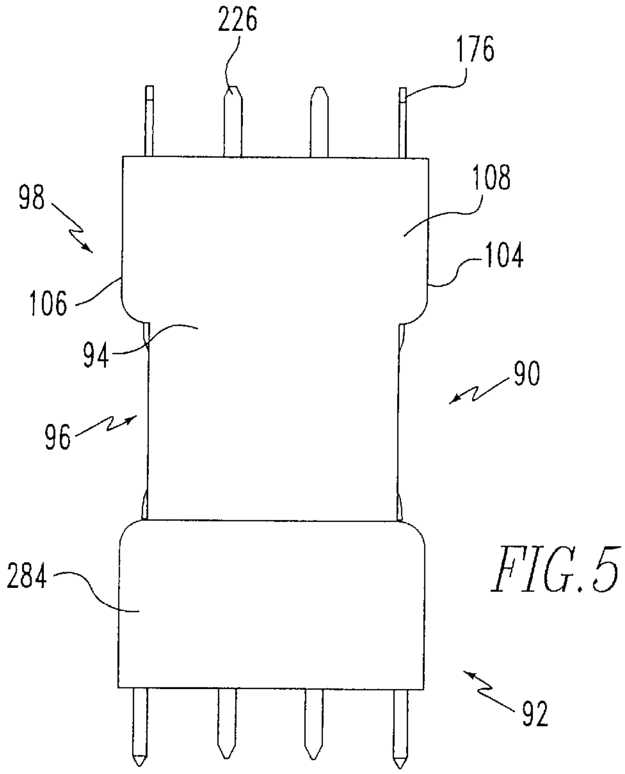
FIG. 5 is an end view of the connector shown in FIG. 4.
Figure 6:
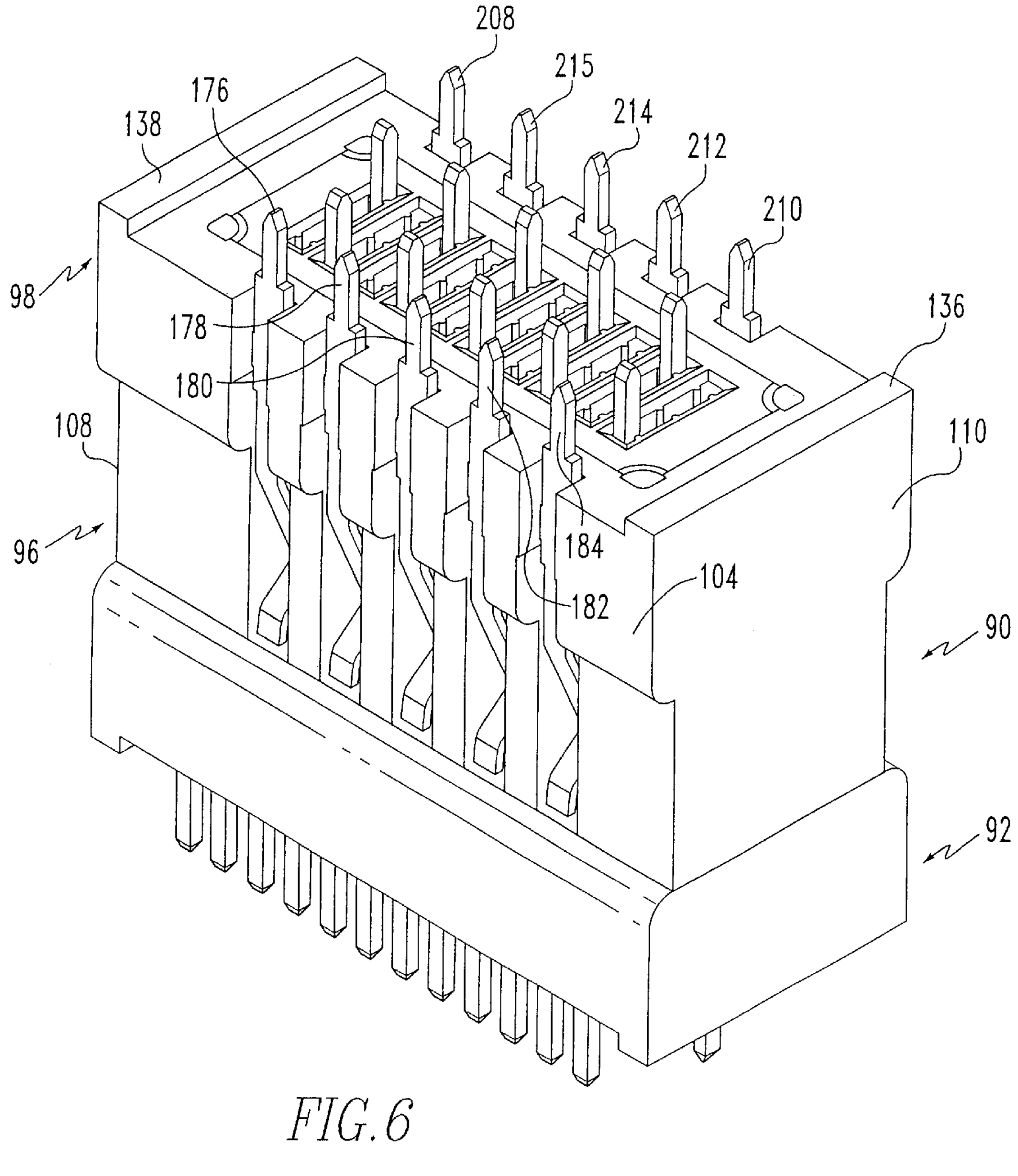
FIG. 6 is a perspective view of the connector shown in FIG. 4.
Figure 7:
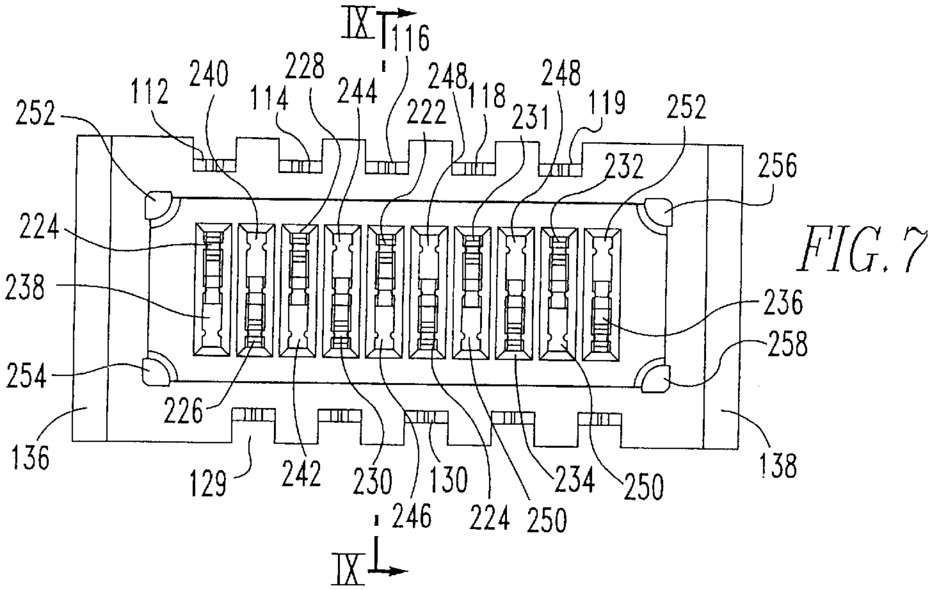
FIG. 7 is an end view of the receptacle element of the connector shown in FIG. 4.
Figure 8:
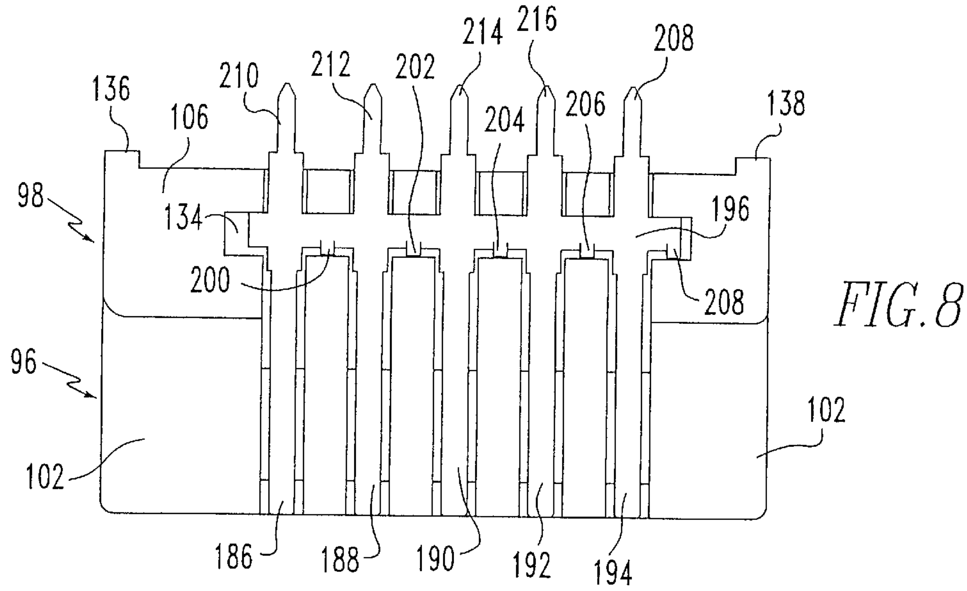
FIG. 8 is a bottom plan view of the receptacle element shown in FIG. 7.

Referring to FIG. 3, another multi-conductor connector is shown wherein there are parallel conductors 66, 68 and 70 which extend perpendicularly between two dielectric and horizontal ground plane 72 mounted on base 73 and horizontal ground plane 74 mounted on base 75. To the sides of the conductors are air spaces 76, 78, 80 and 82 and equipotential lines are shown at 84 and 86.

ELECTRICAL CONNECTOR

Figure 9:
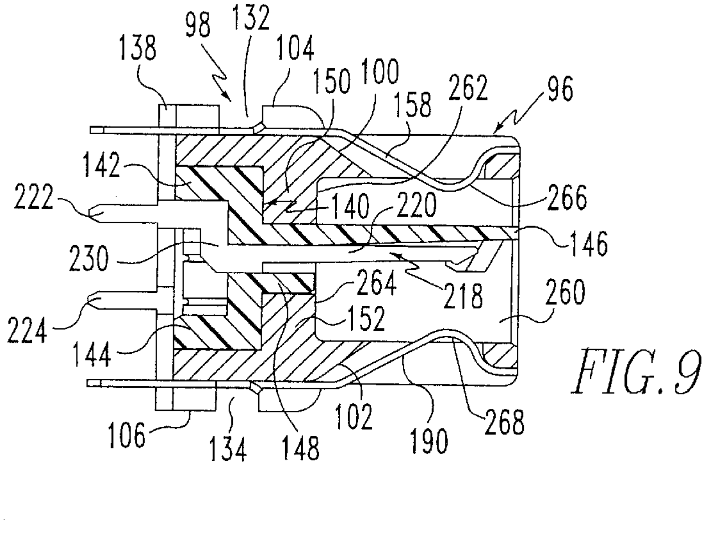
FIG. 9 is a cross sectional view taken through IX—IX in FIG. 7.
Figure 10:
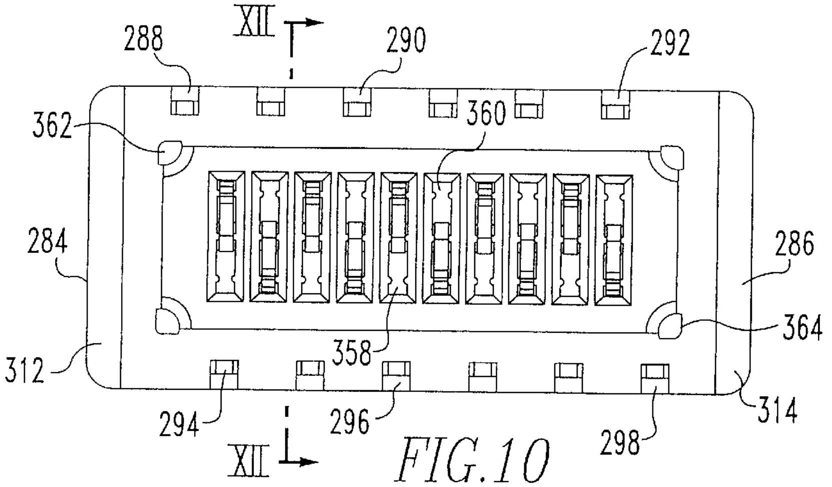
FIG. 10 is an end view of the receptacle element of the preferred embodiment of the present invention shown in FIG. 4.
Figure 11:
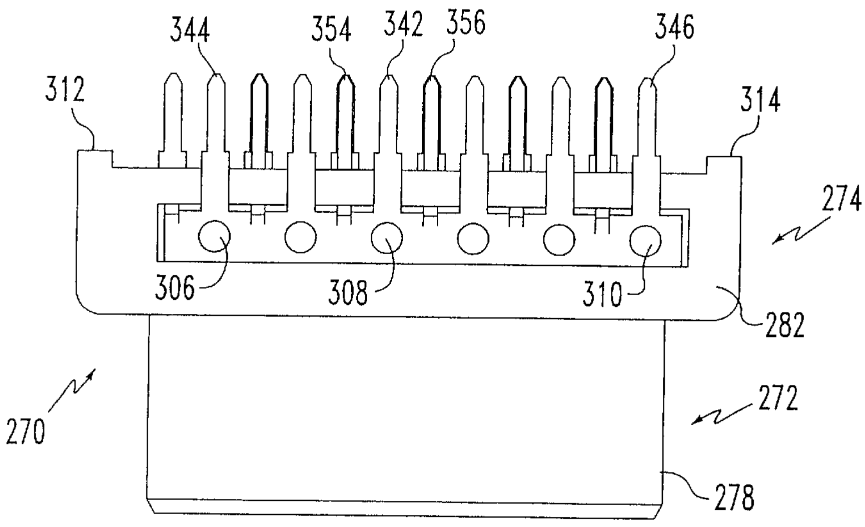
FIG. 11 is a bottom plan view of the receptacle element shown in FIG. 10.
Figure 12:
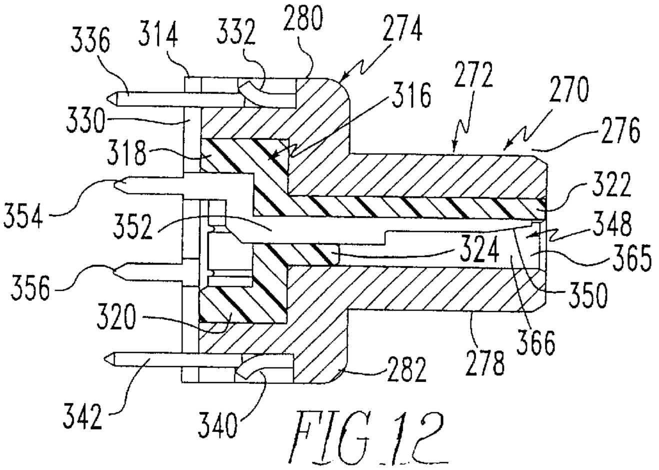
FIG. 12 is a cross sectional view taken through XII—XII in FIG. 10.
Figure 13:
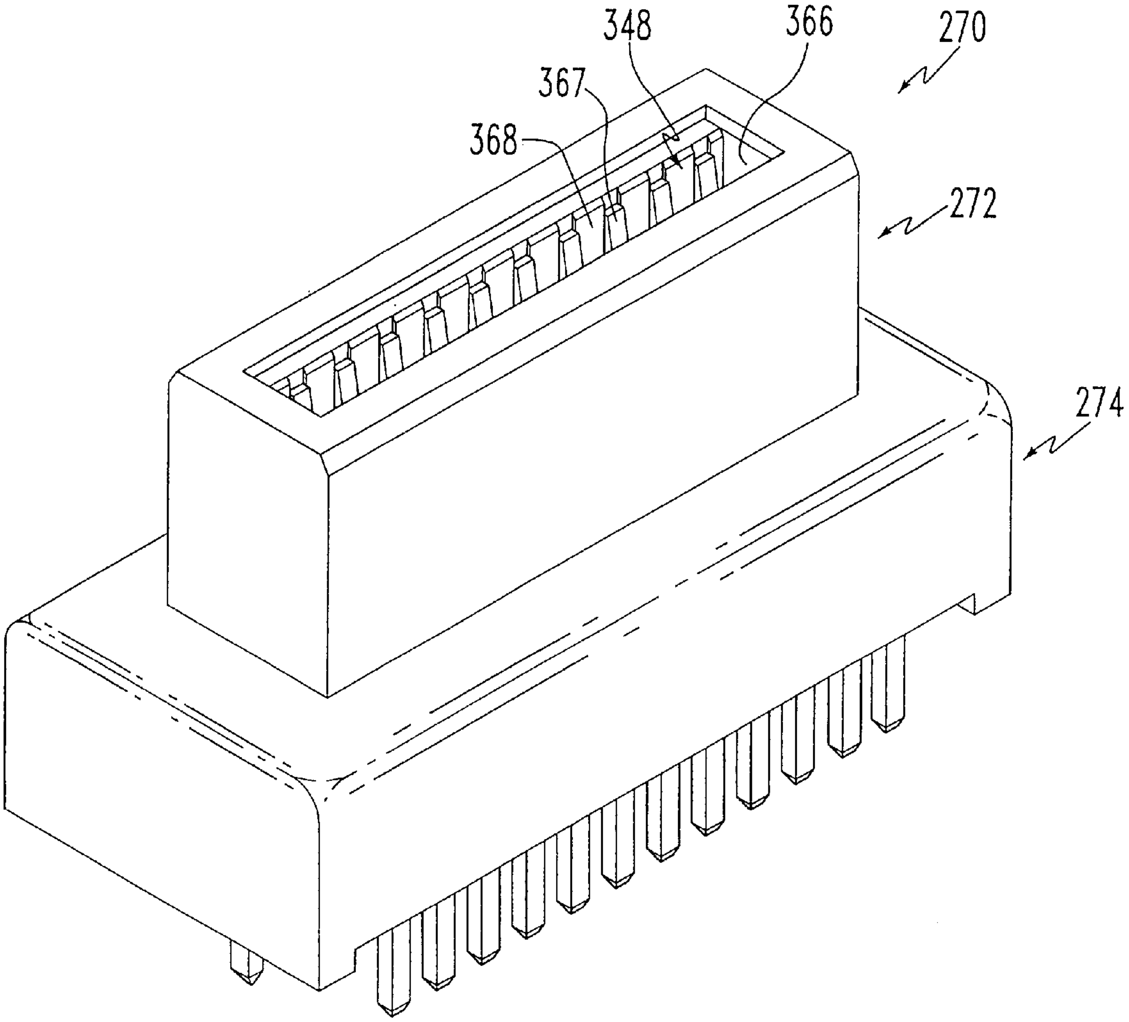
FIG. 13 is a perspective view of the receptacle element shown in FIG. 10.

Referring particularly to FIGS. 4 to 12 it will be seen that the connector of the present invention is generally comprised of a plug shown generally at numeral 90 and a receptacle shown generally at numeral 92. The plug consists of a preferably metallic plug housing 94 which has a narrow front section 96 and a wide rear section 98. The front section has a top side 100 and a bottom side 102. The wide rear section has a top side 104 and a bottom side 106. The plug also has end surfaces 108 and 110. On the top side of both the front and rear sections there are longitudinal grooves 112, 114, 116 and 118 and 119. In these grooves there are also apertures 120, 122, 124 and 126. Similarly on the bottom sides of both the front and rear section there are longitudinal grooves as at 128 which each have apertures as at 130. On the top sides there is also a top transverse groove 132, while on the bottom side there is a similarly positioned bottom transverse groove 134. The plug also has rear standoffs 136 and 138. Referring particularly to FIG. 9 it will be seen that the plug includes a dielectric element 140 which has a rear upward extension 142 and a rear downward extension 144 as well as a major forward extension 146 and a minor forward extension 148. The housing also includes opposed downwardly extending projection 150 and upwardly extending projection 152 which assist in retaining the dielectric in its position. In the longitudinal grooves on the top side of the plug there are top axial ground springs 154, 156, 158,160 and 162. In the transverse groove there is also a top transverse ground spring 164. This transverse ground spring is fixed to the housing by means of ground spring fasteners 166, 168, 170 and 172. At the rearward terminal ends of the longitudinal ground springs there are top grounding contacts 176, 178, 180, 182 and 184. Similarly the grooves on the bottom side of the plug there are bottom longitudinal ground springs 186, 188, 190,192 and 194. In the bottom transverse groove there is a bottom transverse ground spring 196 as with the top transverse ground spring, this spring is fixed in the housing by means of ground spring fasteners 198, 200, 202, 204 and 206. At the rear terminal ends of the ground springs there are bottom ground contacts 208, 210, 212, 214 and 216. The plug also includes a metallic contact section shown generally at 218 which includes a front recessed section 220, a medial contact section 222 and a rearward signal pin 224. An adjacent signal pin is shown at 226. Other signal pins are shown, for example, in FIG. 7 at 228, 230, 232, 234 and 236. These pins pass through slots in the dielectric as at 238, 240, 242, 244, 246, 248 and 250. The dielectric is locked in place by means of locks 252, 254, 256 and 258 which extend from the metal housing. Referring again particularly to FIG. 9 the plug includes a front plug opening 260 and top and bottom interior plug walls 262 and 264. It will also be seen from FIG. 9 that a convex section of the ground springs as at 266 and 268 extend through the apertures in the longitudinal grooves. Referring particularly to FIGS. 10 through 12, it will be seen that the receptacle includes a preferably metallic receptacle housing 270 with a narrow front section 272 and a wider rear section 274. The front section has a topside 276 and a bottom side 278 and the rear section has a topside 280 and 282. The receptacle also has opposed ends 284 and 286. On the top sides of the receptacle there are longitudinal grooves 288, 290 and 292. Similarly on the bottom surface there are longitudinal grooves as at 294, 296 and 298. On the top surface there are also apertures as at 300, 302 and 304. On the bottom surface there are several apertures as at 306, 308 and 310. The receptacle also includes rear standoffs 312 and 314. Referring particularly to FIG. 12, the receptacle includes a dielectric element shown generally at numeral 316 which has a rear upward extension 318, a rear downward extension 320, a major forward extension 322 and a minor forward extension 324. The dielectric is retained in position by means of downward housing projection 326 and upward interior housing projection 328 along with rear retaining plate 330. Retained within each of the apertures there is a ground spring as at 332 which connects to a top ground post 334. Other top ground posts as at 336 and 338 are similarly positioned. Bottom ground springs as at 340 are connected to ground posts as at 342 while other ground posts as at 344 and 346 are positioned adjacent to similar ground springs. Referring particularly to FIG. 12, the receptacle also includes a metallic contact section shown generally at numeral 348 which has a front recess section 350, a medial contact section 352 and a rearward signal pin 354. An adjacent pin is shown at 356. These pins extend rearwardly through slots as at 358 and 360. The dielectric is further retained in the housing by dielectric locks as at 362 and 364. The receptacle also includes a front opening 365 and an interior housing surface 367. Referring particularly to FIG. 13, this perspective view of the receptacle shows the structure of the metallic contact section 350 in greater detail to reveal a plurality of alternating longitudinal ridges as at 366 and grooves 368 as at which engage similar structures on metallic contact 218 of the receptacle.

Figure 14:
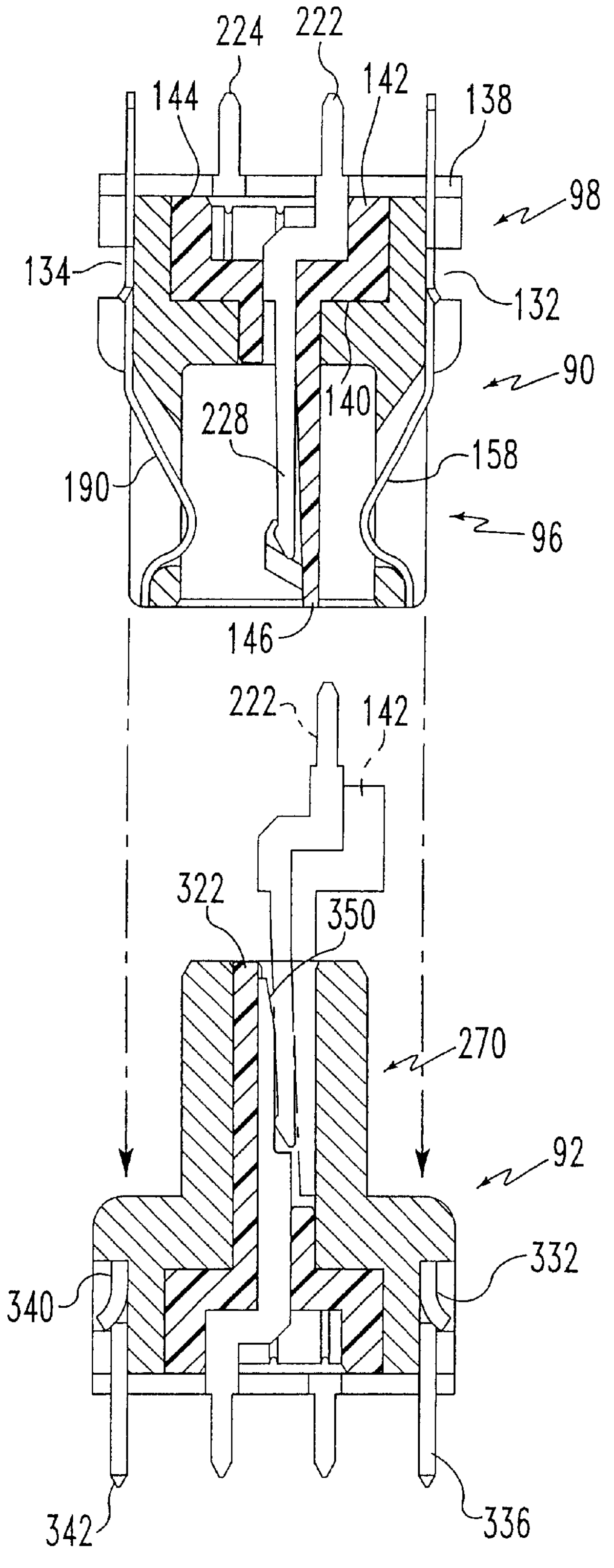
FIG. 14 is a cross sectional view of the plug and receptacle elements of the connector shown in FIG. 4 prior to engagement.
Figure 15:
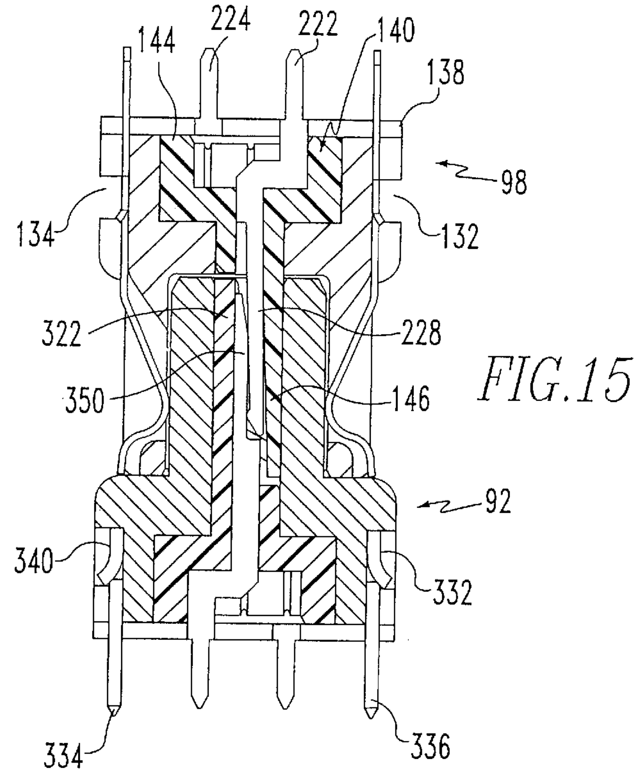
FIG. 15 is a cross sectional view taken through XV—XV in FIG. 4.

Referring particularly to FIGS. 14 and 15, the plug and receptacle are shown respectively in a disengaged and in an engaged configuration. It will be observed that the major forward extension of the dielectric section of the plug abuts the minor forward extension of the dielectric section 146 of the receptacle end to end. The major forward extension of the dielectric section of the receptacle abuts the minor forward extension of the dielectric section of the plug end to end. It will also be observed on the metallic section of the plug the terminal recess receives the metallic element of the receptacle in side by side abutting relation. The terminal recess of the metallic contact element of the receptacle receives the metallic contactelement of the plug in side by side abutting relation. The front end of the terminal housing abuts the inner wall of the plug. The ground springs of the plug also abut and make electrical contact with the approved front side walls of the receptacle. It will be noted that when the connector shown in FIG. 15 where the plug and receptacle housings are axially engaged, the plug metallic contact and receptacle metallic contact extend axially inwardly respectively from the plug dielectric element and the receptacle dielectric element to abut each other. It will also be noted that the plug and receptacle dielectric elements extend radially outwardly respectfully from the plug and receptacle metallic contact elements.

Figure 16:
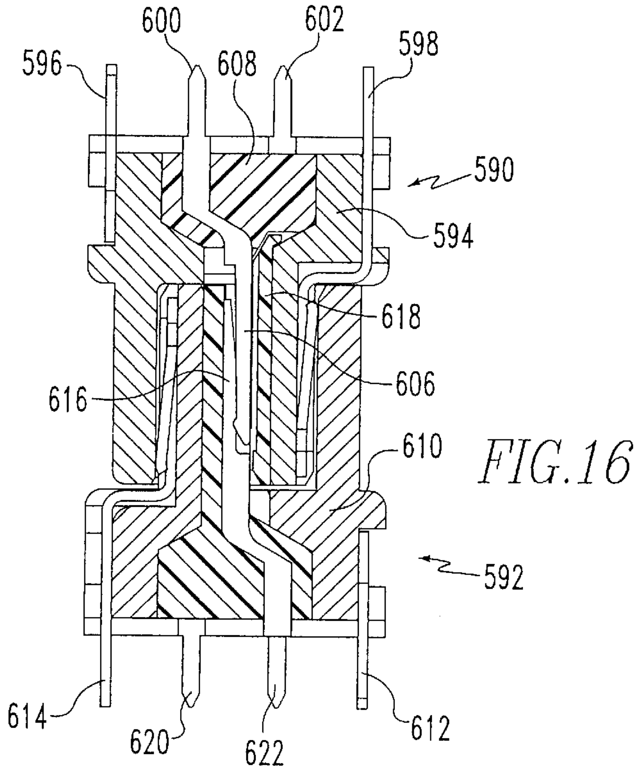
FIG. 16 is a cross sectional view corresponding to FIG. 13 of another preferred embodiment of the connector of the present invention.

Referring to FIG. 16, it will be seen that an alternate embodiment of the connector of the present invention is generally comprised of a plug shown generally at numerals 590 and a receptacle shown generally at numerals 592. The plug consists of a plug housing 594. There is also a plug ground contact 596, plug ground spring 598, plug signal pins 600 and 602, plug contact 606 and dielectric insert 608. The receptacle consists of receptacle housing 610, receptacle ground contact 612, receptacle ground springs 614 and receptacle contact 616. An alignment frame 618 and receptacle signal pins 620 and 622 are also provided. It will be appreciated that this arrangement affords the same I-beam geometry as was described above.

COMPARATIVE TEST

Figure 17:
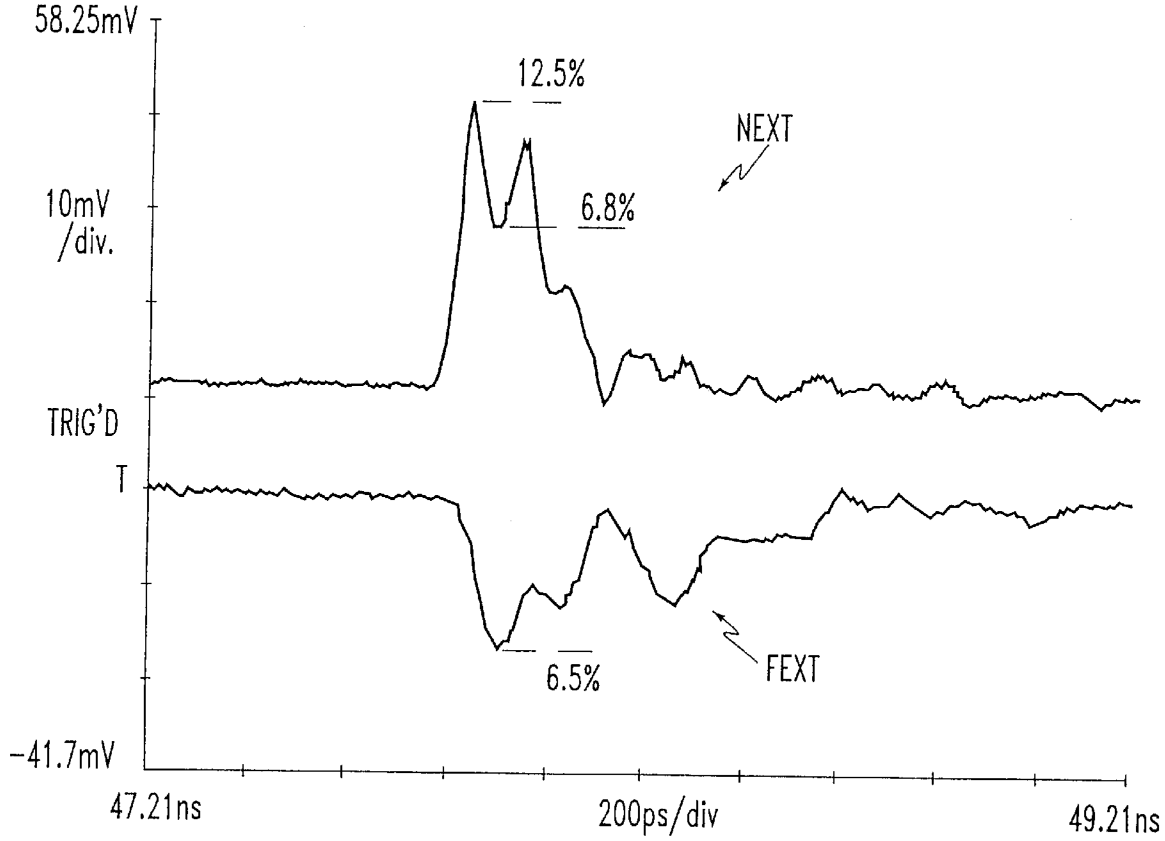
FIGS. 17 and 18 are graphs illustrating the results of comparative tests described hereafter.

The measured near end (NEXT) and far end (FEXT) cross talk at the rise time of 35 p sec, for a 0.05" pitch scaled up model of a connector made according to the foregoing first described embodiment are shown in FIG. 17. The valley in the NEXT wave form of approximately 7% is the near end cross talk arising in the I-beam section of the connector. The leading and trailing peaks come from cross talk at the input and output sections of the connector where the I-beam geometry cannot be maintained because of mechanical constraints.

Figure 18:
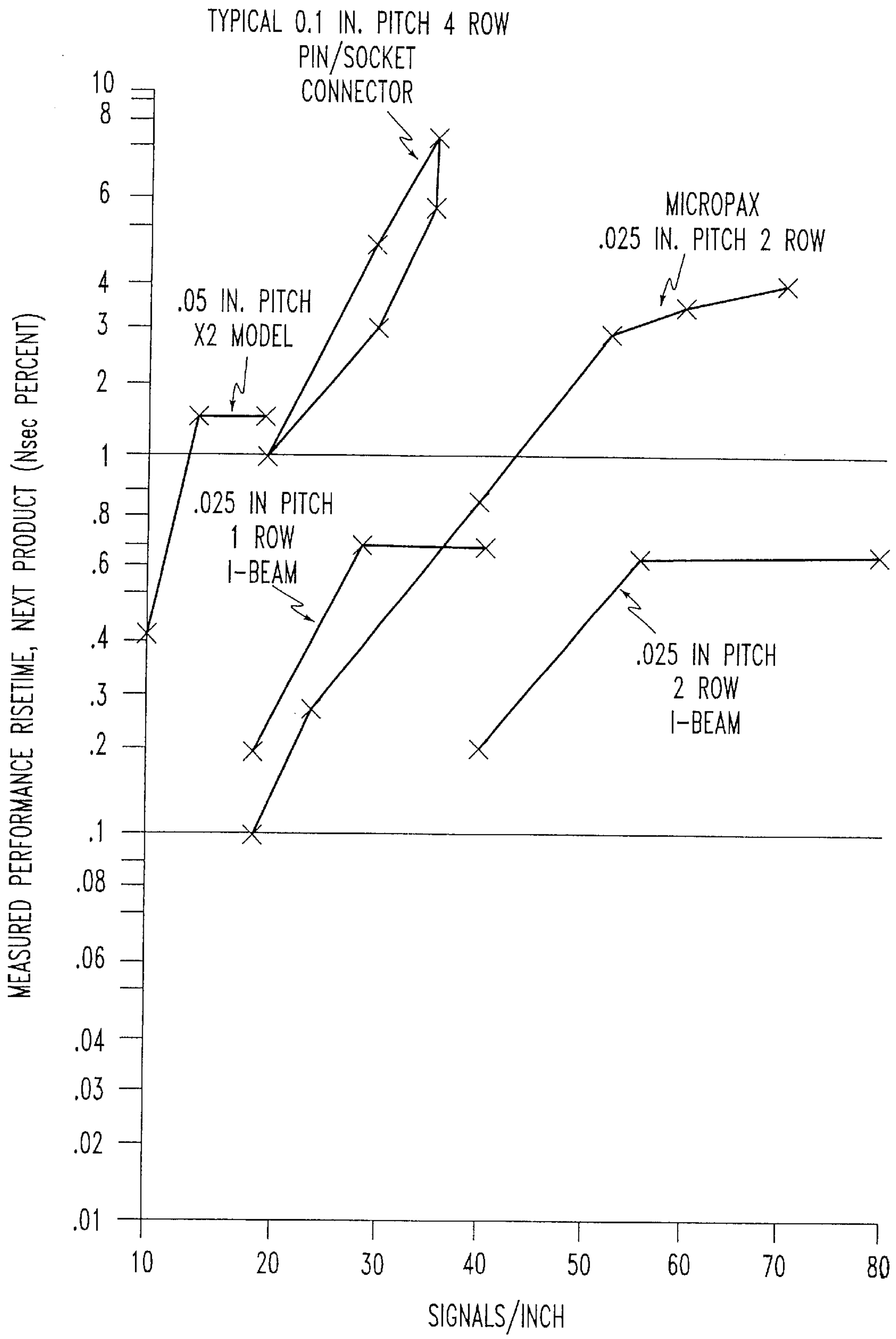

The cross talk performance for a range of risetimes greater than twice the delay through the connector of the connector relative to other connector systems is best illustrated by a plot of the measured rise time-cross talk product (nanoseconds percent) versus signal density (signals/inch). The different signal densities correspond to different signal to ground ratio connections in the connector. The measured rise time-cross talk product of the scaled up 0.05" pitch model I-beam connector is shown in FIG. 18 for three signal to ground ratios; 1:1, 2:1, and all signals. Since the cross talk of the scaled up model is twice that of the 0.025 inch design, the performance of the 0.025 inch pitch, single row design is easily extrapolated to twice the density and one half the model cross talk. For the two row design, the density is four times that of the model and the cross talk is again one half. The extrapolated performance of the one row and two row 0.025 inch pitch connectors are also shown in FIG. 18 relative to that of a number of conventional connectors as are identified in that figure. The rise time cross talk product of the 0.025 inch pitch I-beam connector for all signals is 0.75 and is much less than that of the other interconnects at correspondingly high signal to ground ratios. As seen in FIG. 18, it appears that the rise time cross-talk product of the present invention is generally independent of signal density for signal to ground ratios greater than 1:1.

ELECTRICAL CABLE ASSEMBLY

Figure 19:
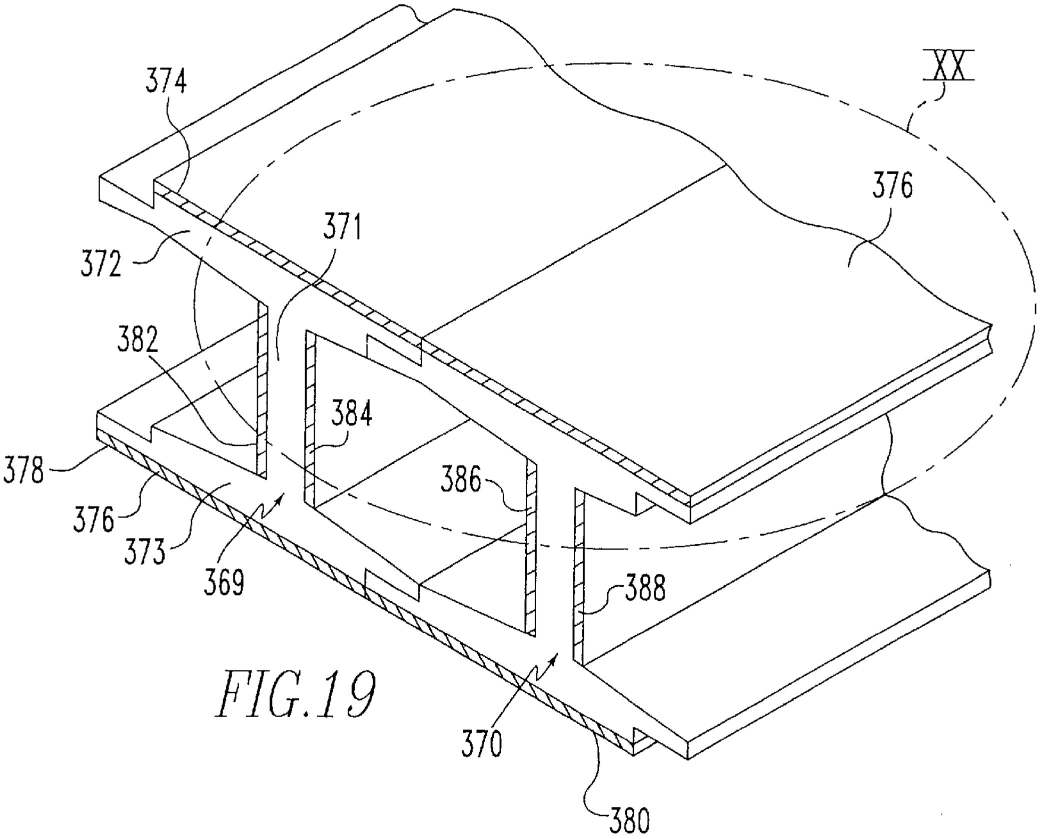
FIG. 19 is a perspective view of a preferred embodiment of a cable assembly of the present invention.
Figure 20:
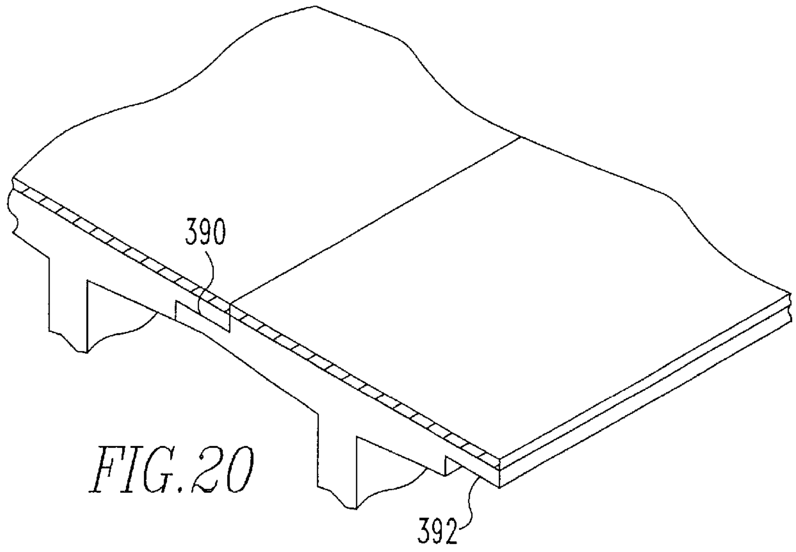
FIG. 20 is a detailed view of the area within circle XVIII in FIG. 17.
Figure 21:
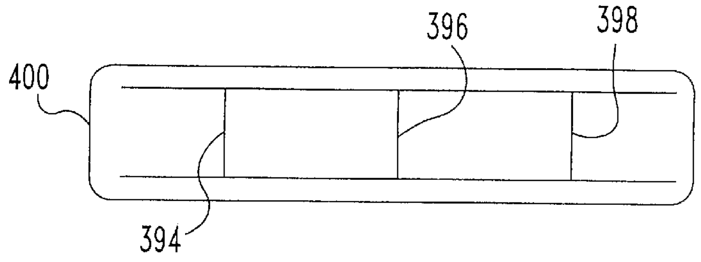
FIG. 21 is a cross sectional view of another preferred embodiment of a cable assembly of the present invention.
Figure 22:
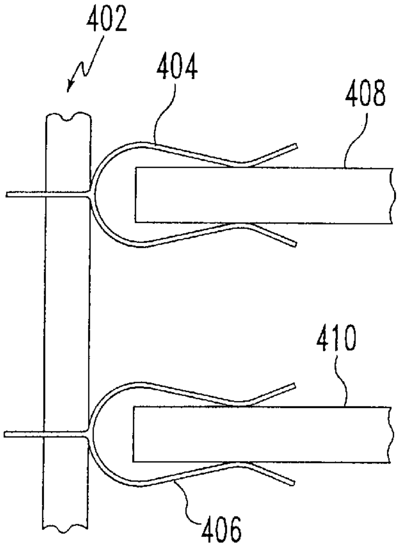
FIG. 22 is a side elevational view of the cable assembly shown in FIG. 17 in use with a receptacle.
Figure 23:
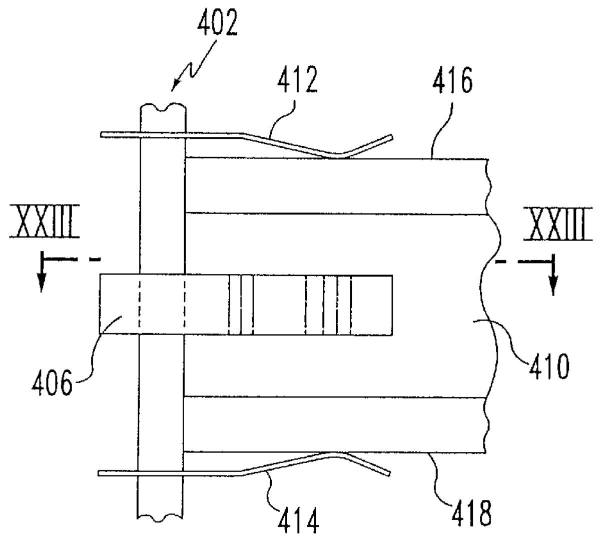
FIG. 23 is a cross sectional view taken through XXIII—XXIII in FIG. 20.
Figure 24:
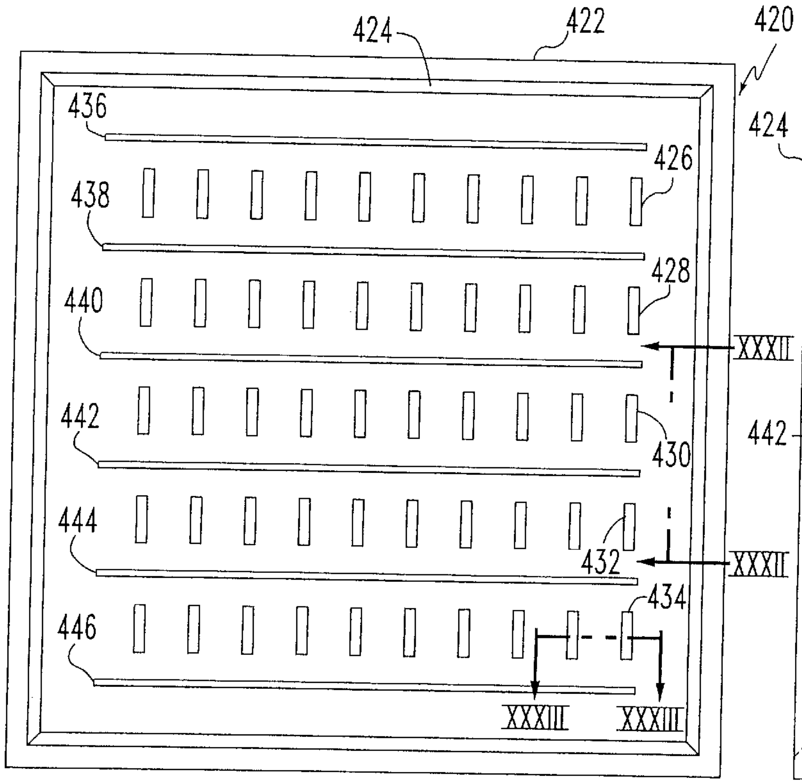
FIG. 24 is a top plan view of a plug section of another preferred embodiment of the connector of the present invention.
Figure 26:
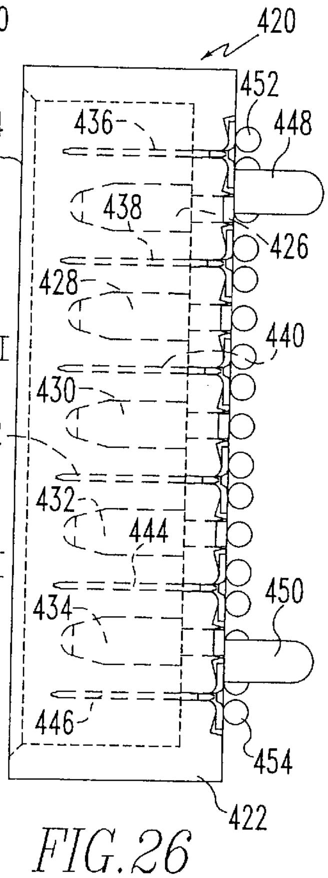
FIG. 26 is an end view of the plug section shown in FIG. 24.
Figure 27:
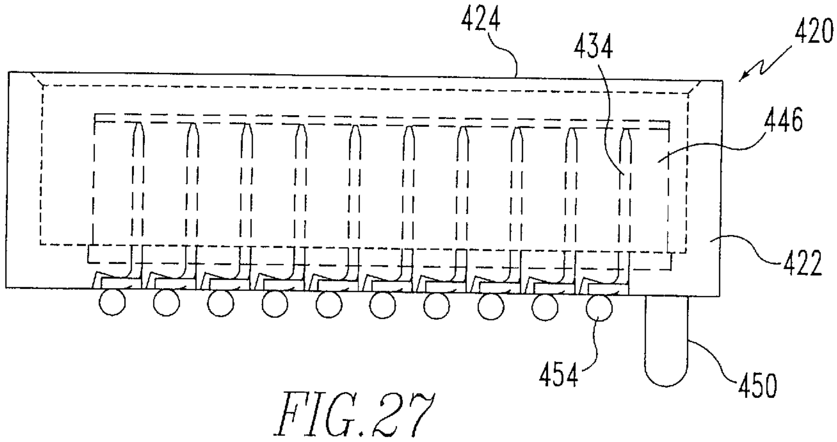
FIG. 27 is a side elevational view of the plug section shown in FIG. 24.
Figure 25:
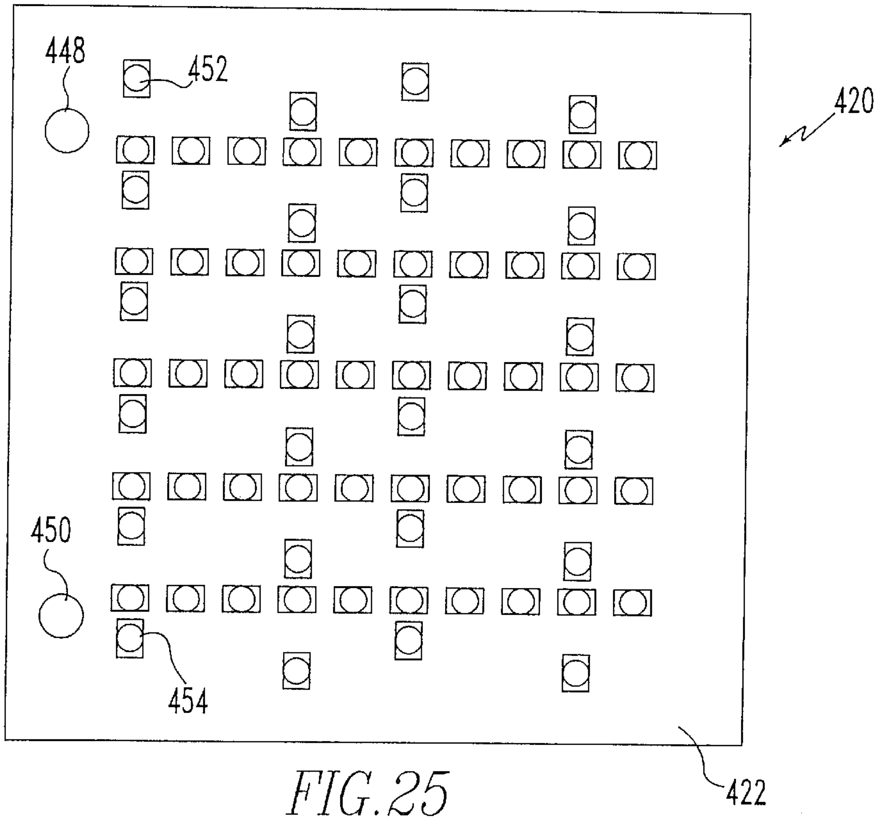
FIG. 25 is a bottom plan view of the plug section shown in FIG. 24.
Figure 29:
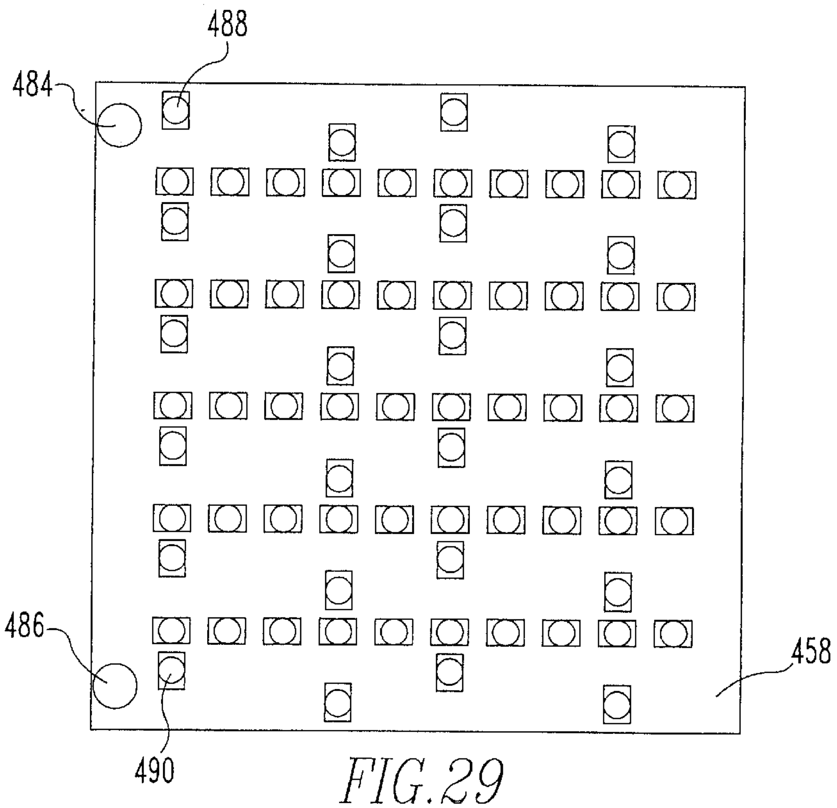
FIG. 29 is a bottom plan view of the receptacle shown in FIG. 28.
Figure 28:
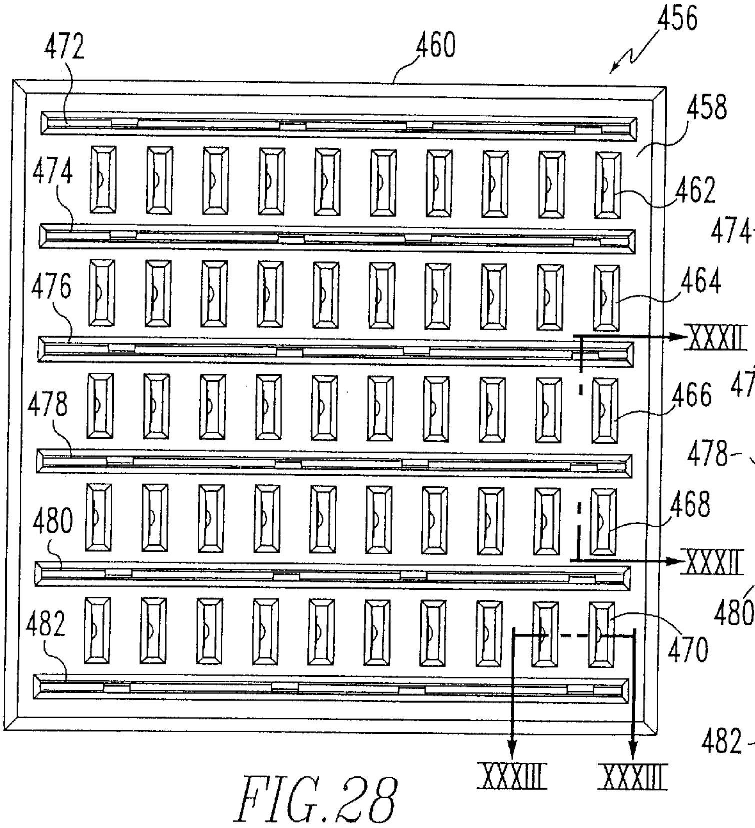
FIG. 28 is a top plan view of a receptacle section which is engageable with the plug section of a preferred embodiment of the present invention shown in FIG. 24.
Figure 30:
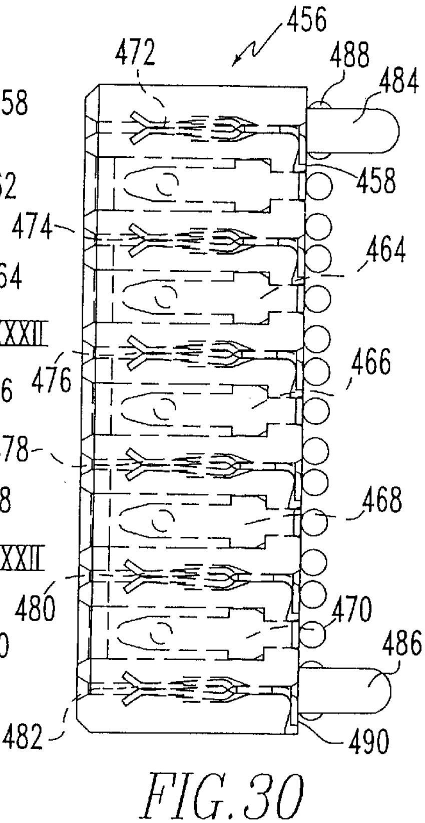
FIG. 30 is an end view of the receptacle shown in FIG. 28.
Figure 31:
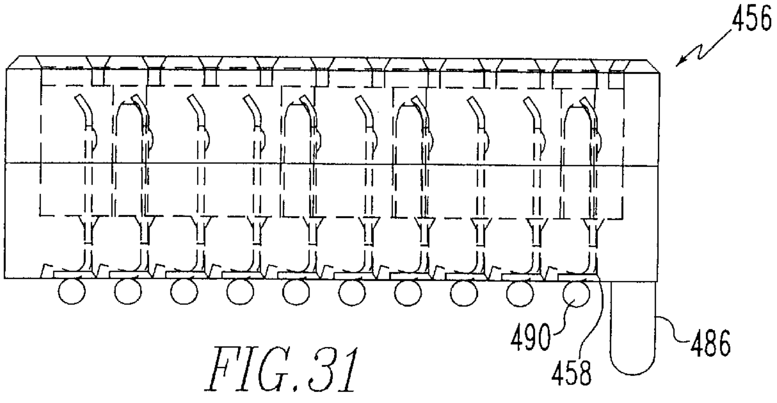
FIG. 31 is a side elevational view of the receptacle shown in FIG. 28.

Referring to FIGS. 19 and 20, it will be seen that the beneficial results achieved with the connector of the present invention may also be achieved in a cable assembly. That is, a dielectric may be extruded in an I-beam shape and a conductor may be positioned on that I-beam on the web and the horizontal flanges so as to achieve low cross talk as was described above. I-beam dielectric extrusions are shown at numerals 369 and 370. Each of these extensions has a web 371 which is perpendicularly interposed at its upper and lower edges between flanges as at 372 and 373. The flanges have inwardly facing interior surfaces and outwardly facing exterior surfaces which have metallized top ground planes sections 374 and 376 and metallized bottom ground plane sections respectively at 378 and 380. The webs also have conductive layers on their lateral sides. I-beam extrusion 369 has vertical signal lines 382 and 384 and I-beam extrusion 370 has vertical signal lines 386 and 388. These vertical signal lines and ground plane sections will preferably be metallized as for example, metal tape. It will be understood that the pair of vertical metallized sections on each extrusion will form one signal line. The property of the I-beam geometry as it relates to impedance and cross talk control will be generally the same as is discussed above in connection with the connector of the present invention. Referring particularly to FIG. 20, it will be seen that the I-beam extrusions have interlocking steps as at 390 and 392 to maintain alignment of each I-beam element in the assembly. Referring to FIG. 21, I-beam elements shown generally at 394, 396 and 398 are metallized (not shown) as described above and may be wrapped in a foil and elastic insulative jacket shown generally at numeral 400. Because of the regular alignment of the I-beam element in a collinear array, the I-beam cable assembly can be directly plugged to a receptacle without any fixturing of the cable except for removing the outer jacket of foil at the pluggable end. The receptacle can have contact beams which mate with blade elements made up of the ground and signal metallizations. Referring particularly to FIG. 23, it will be seen, for example, that the receptacle is shown generally at numeral 402 having signal contacts 404 and 406 received respectively vertical sections of I-beam elements 408 and 410. Referring to FIG. 22, the receptacle also includes ground contacts 412 and 414 which contact respectively the metallized top ground plane sections 416 and 418.

BALL GRID ARRAY CONNECTOR

The arrangement of dielectric and conductor elements in the I-beam geometry described herein may also be adapted for use in a ball grid array type electrical connector. A plug for use in such a connector is shown in FIGS. 24–27. Referring to these figures, the plug is shown generally at numeral 420. This plug includes a dielectric base section 422, a dielectric peripheral wall 424, metallic signal pins as at 426, 428, 430, 432 and 434 are arranged in a plurality of rows and extend perpendicularly upwardly from the base section. Longitudinally extending metallic grounding or power elements 436, 438, 440, 442, 444 and 446 are positioned between the rows of signal pins and extend perpendicularly from the base section. The plug also includes alignment and mounting pins 448 and 450. On its bottom side the plug also includes a plurality of rows of solder conductive tabs as at 452 and 454.

Figure 32:
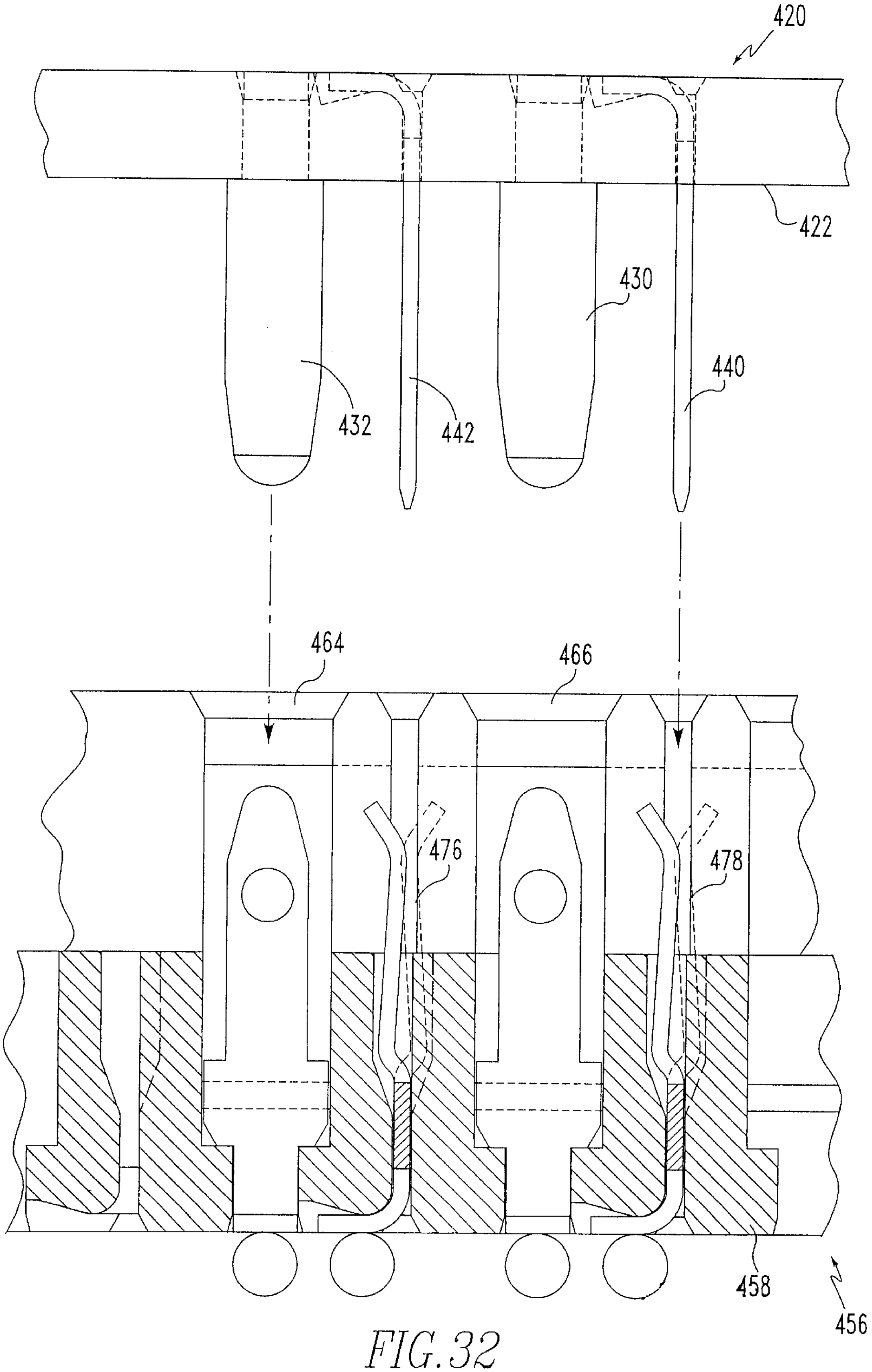
FIG. 32 is a fragmented cross sectional view as taken through lines XXXII—XXXII in FIGS. 24 and 28 showing those portions of the plug and receptacle shown in those drawings in an unengaged position.
Figure 33:
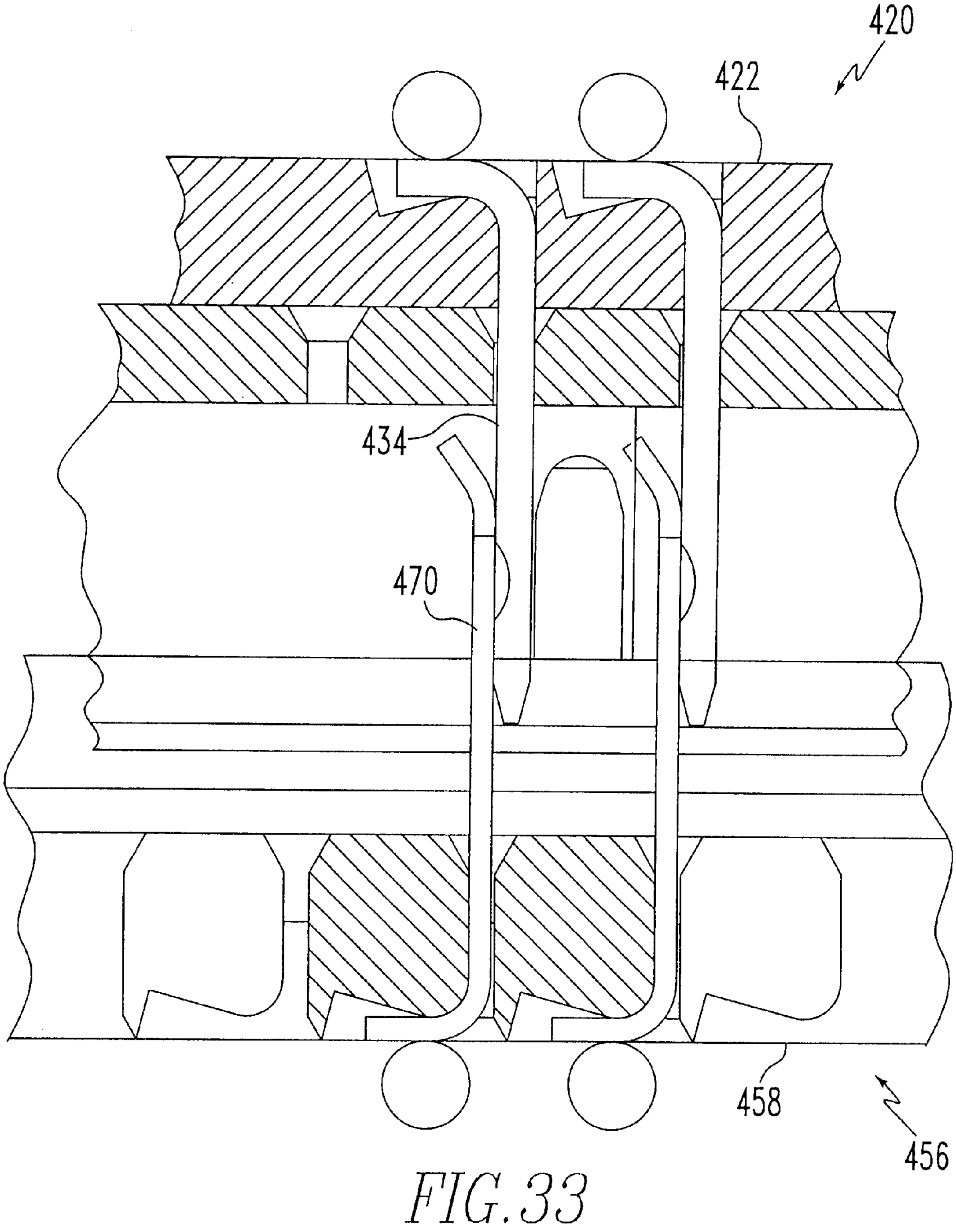
FIG. 33 is a fragmented cross sectional view as would be shown as taken through lines XXXIII—XXXIII in FIGS. 24 and 28 if those elements were engaged.

Referring to FIGS. 28–31, a receptacle which mates with the plug 420 is shown generally at numeral 456. This receptacle includes a base section dielectric 458, a peripheral recess 460 and rows of metallic pin receiving recesses as at 462, 464, 466, 468 and 470. Metallic grounding or power elements receiving structures 472, 474, 476, 478, 480 and 482 are interposed between the rows of pin receiving recesses. On its bottom side the receptacle also includes alignment and mounting pins 484 and 486 and rows of solder conductive pads as at 488 and 490. From FIGS. 32–33 it will be observed that the same I-beam geometry as was described above is available with this arrangement.

It will be appreciated that electrical connector has been described which by virtue of its I-beam shaped geometry allows for low cross talk and impedance control.

It will also be appreciated that an electrical cable has also been described which affords low cross talk and impedance control by reason of this same geometry.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical cable assembly for reducing cross-talk and controlling impedance, having a longitudinal length and comprising a metallic element generally extending along said length and flanked by opposed dielectric elements, each dielectric element including a ground plane, wherein said metallic element is essentially transverse relative to said ground planes.

2. The electrical cable assembly as recited in claim 1, wherein said metallic element and said dielectric elements form a generally I-beam shape.

3. The electrical cable assembly as recited in claim 1, wherein said metallic element comprises a plurality of metallic elements, each metallic element positioned relative to the other metallic elements and to the ground planes such that a rise time cross-talk product is generally independent of signal density for signal-to-ground ratios greater than approximately 1:1.

4. The electrical cable assembly as recited in claim 1, wherein said ground planes are generally parallel.

5. The electrical cable assembly as recited in claim 1, further comprising a web extending between said dielectric elements; wherein said metallic element resides on said web.

6. The electrical cable assembly as recited in claim 5, wherein said metallic element is a metallized surface of said web.

7. The electrical cable assembly as recited in claim 1, wherein said metallic element comprises metal tape.

8. The electrical cable assembly as recited in claim 1, wherein said metallic element is generally planar.

9. The electrical cable assembly as recited in claim 1, further comprising an insulative jacket surrounding the cable assembly.

10. The cable assembly as recited in claim 1, in combination with an electrical connector mateable with the cable assembly, the cable assembly and the connector forming an electrical connector system.

11. An electrical cable assembly for reducing cross-talk and controlling impedance, comprising:

- a pair of spaced, generally parallel dielectric flanges, each having:
  - an exterior surface; and
  - an interior surface, said interior surface of one of said flanges facing said interior surface of the other of said flanges;
- a first conductive element on at least a part of said exterior surface of each of said flanges forming respective ground planes;
- a plurality of dielectric webs extending between said flanges at an angle to said ground planes, each having:
  - opposed major surfaces defining sides; and
  - opposed minor surfaces defining edges, each edge fixed to said interior surface of a respective one of said flanges; and a plurality of second conductive elements, each on at least part of one of said sides of a respective one of said webs;

wherein at least one of said sides of at least one of said webs reside in an interior of the electrical cable assembly and at least one of said second conductive elements reside in the interior.

12. The electrical cable assembly as recited in claim 11, wherein said web extends at an angle from said flanges.

13. The electrical cable assembly as recited in claim 12, wherein said webs extend transverse to said flanges.

14. The electrical cable assembly as recited in claim 11, wherein each said second conductive element is positioned relative to the other second conductive elements and to said ground planes such that a rise time cross-talk product is generally independent of signal density for signal-to-ground ratios greater than approximately 1:1.

15. The electrical cable assembly as recited in claim 11, wherein said second conductive elements reside on both sides of said webs.

16. The electrical cable assembly as recited in claim 11, wherein said conductive elements comprise metallized surfaces.

17. The electrical cable assembly as recited in claim 11, wherein said flanges include structure adapted to interact with corresponding structure on a second electrical cable assembly for placing the second electrical cable assembly adjacent the electrical cable assembly.

18. The electrical cable assembly as recited in claim 17, wherein said structure comprises a stepped surface.

19. The cable assembly as recited in claim 11, in combination with an electrical connector mateable with the cable assembly, the cable assembly and the connector forming an electrical connector system.

20. An electrical cable assembly for reducing cross-talk and controlling impedance, comprising:

a pair of dielectric elements, each having a dielectric constant and a ground plane;

a plurality of discrete conductive elements extending between said dielectric elements and having:

opposed major surfaces defining sides; and opposed minor surfaces defining edges, each edge fixed to a respective one of said dielectric elements for edge coupling to said ground planes; and a material abutting at least one of said sides of said plurality of conductive elements and having a dielectric constant less than said dielectric constants of said dielectric elements.

21. The electrical cable assembly as recited in claim 20, wherein said dielectric constant of said material is approximately $\in_0$.

22. The electrical cable assembly as recited in claim 21, wherein said material is air.

23. The electrical cable assembly as recited in claim 20, wherein said dielectric constants of said dielectric elements are approximately equal.

24. The electrical cable assembly as recited in claim 20, wherein said conductive elements and said dielectric elements form a generally I-beam shape.

25. The electrical cable assembly as recited in claim 20, wherein each said conductive element is positioned relative to the other conductive elements and to said ground planes such that a rise time cross-talk product is generally independent of signal density for signal-to-ground ratios greater than approximately 1:1.

26. The cable assembly as recited in claim 20, in combination with an electrical connector mateable with the cable assembly, the cable assembly and the connector forming an electrical connector system.

27. A method of reducing cross-talk and controlling impedance in an electrical cable assembly having a longitudinal length, comprising the steps of:

providing opposed dielectric elements, each dielectric element including a ground plane;

providing a plurality of discrete metallic elements generally extending along the length, each metallic element having opposed major surfaces defining sides and opposed minor surfaces defining edges; and positioning said metallic elements between said dielectric elements so that said metallic elements are essentially transverse to said ground planes, with each of said edges of said metallic elements adjacent a respective one of said ground planes for edge coupling to said ground planes.

28. The method of reducing cross-talk and controlling impedance in an electrical cable assembly as recited in claim 27, wherein said dielectric elements providing step comprises the step of providing opposed dielectric elements, each dielectric element having a dielectric constant and including a ground plane; and further comprising the step of providing a material adjacent at least one of said sides of said metallic element, wherein said material has a dielectric constant less than said dielectric constants of said dielectric elements.

29. In an electrical cable assembly having a strip line arrangement of a plurality of signal contacts flanked by ground planes, the improvement comprising said signal contacts having an elongated cross-section defined by minor surfaces and major surfaces, with said major surfaces extending transversely between said ground planes.

* * * * *